United States Patent
Aubert

(10) Patent No.: US 8,410,777 B2
(45) Date of Patent: Apr. 2, 2013

(54) NMR IMAGING SYSTEM WITH REDUCED CRYOGENIC LOSSES AND REDUCED ACOUSTIC NOISE

(75) Inventor: Guy Aubert, Poitiers (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 448 days.

(21) Appl. No.: 12/766,338

(22) Filed: Apr. 23, 2010

(65) Prior Publication Data
US 2010/0271024 A1   Oct. 28, 2010

(30) Foreign Application Priority Data
Apr. 27, 2009   (FR) ........................................ 09 52746

(51) Int. Cl.
*G01V 3/00*   (2006.01)
(52) U.S. Cl. ........................................... 324/307
(58) Field of Classification Search ........... 324/300–322
See application file for complete search history.

(56) References Cited

U.S. PATENT DOCUMENTS

| | | | |
|---|---|---|---|
| 4,847,985 A | 7/1989 | Aubert | |
| 5,111,147 A | 5/1992 | Aubert | |
| 5,124,652 A | 6/1992 | Aubert | |
| 6,107,799 A | 8/2000 | Sellers et al. | |
| 6,707,302 B2 | 3/2004 | Ries | |
| 6,748,749 B2 * | 6/2004 | Tsuda | 62/49.2 |
| 7,141,974 B2 | 11/2006 | Edelstein et al. | |
| 7,375,526 B2 | 5/2008 | Edelstein et al. | |
| 7,397,244 B2 * | 7/2008 | Cirel | 324/318 |
| 7,514,928 B2 | 4/2009 | Westphal | |
| 7,928,820 B2 * | 4/2011 | Chiba et al. | 335/216 |
| 7,990,143 B2 | 8/2011 | Aubert | |
| 8,085,047 B2 * | 12/2011 | Huang et al. | 324/318 |
| 8,143,896 B2 * | 3/2012 | McDowell et al. | 324/322 |
| 8,253,416 B2 * | 8/2012 | Ma et al. | 324/318 |

FOREIGN PATENT DOCUMENTS

| | | |
|---|---|---|
| EP | 0 350 640 | 1/1990 |
| FR | 2588997 | 10/1985 |
| FR | 2621125 | 9/1987 |
| WO | WO 2007/048983 | 5/2007 |

OTHER PUBLICATIONS

Edelstein, W., "MRI Acoustic Noise: Sources and Mitigation," ISMRM High Field Workshop, Mar. 25-28, 2007.

(Continued)

*Primary Examiner* — Dixomara Vargas
(74) *Attorney, Agent, or Firm* — Preti Flaherty Beliveau & Pachios LLP

(57) ABSTRACT

A magnetic resonance imaging system having an exterior cryogenic enclosure containing a device for creating an intense main magnetic field in a usable interior tunnel space an RF exciter, a set of solenoid gradient windings in a cylindrical space around the interior tunnel space and electronic control circuits. The cryogenic enclosure includes an interior cylindrical space vacuum at room temperature having the set of windings therein, at least one thermal screen in a temperature range of 20° K to 80° K, a cold box below 5° K, and a former supporting the exciter for creating an intense main magnetic field. To reduce acoustic noise and cryogenic losses, an additional envelope is between the set of windings and the vacuum enclosure, the additional envelope being of a conductive material having electrical resistivity at least $7\times10^{-8}$ $\Omega \cdot m$ and having a characteristic frequency no more than the characteristic frequencies of each of the other components of the exterior cryogenic enclosure.

12 Claims, 7 Drawing Sheets

OTHER PUBLICATIONS

Hanzelka, P. et al., "Problems of measurement of the helium boil off rate of tomographic magnets," Cryogenics 39 (1999) pp. 647-649.

Indium Corporation of America, Europe and Asia, Alloy Chart, indium.com/products/alloychart.php.

Kamal, M. et al., "Structure, mechanical properties and electrical resistivity of rapidly solidified Pb-Sn-Cd and Pb-Bi-Sn-Cd alloys," Journal of Materials Science: Materials in Electronics 9 (1998) pp. 425-428.

Sanders, J. "An Improved First-Approximation Theory for Thin Shells," National Aeronautics and Space Administration, Technical Report R-24, 1959.

Simmonds J., "A Set of Simple, Accurate Equations for Circular Cylindrical Elastic Shells," Int. J. Solids Structures, 1966, vol. 2, pp. 525-541.

Tomasi, D. et al., "Echo Planar Imaging at 4 Tesla With Minimum Acoustic Noise," Journal of Magnetic Resonance Imaging, 18: 128-130 (2003).

Vedrine, P. et al., "The Whole Body 11.7 T MRI Magnet for Iseult/INUMAC Project," IEEE Transactions on Applied Superconductivity, vol. 18, No. 2, Jun. 2008, pp. 868-873.

* cited by examiner

NMR IMAGING SYSTEM WITH REDUCED CRYOGENIC LOSSES AND REDUCED ACOUSTIC NOISE

FIELD OF THE INVENTION

The present invention provides an NMR (nuclear magnetic resonance) imaging system with reduced cryogenic losses and reduced acoustic noise.

The invention also provides a method of reducing both acoustic noise and cryogenic losses in a magnetic resonance imaging (MRI) system.

PRIOR ART

One example of magnetic resonance imaging apparatus is described in patent document EP 1 952 170 (reference [1]), for example.

One such MRI apparatus 7, shown highly diagrammatically in FIG. 1, essentially comprises the following elements:
- a magnet 1 that creates a constant and substantially uniform (i.e. homogeneous) main magnetic field $\vec{B}_0$ in an area of interest 4 (a portion to be imaged of the object or patient 5). In most current apparatus this magnet 1 includes superconductor windings 11, 12 that need to be cooled to a very low temperature in order to work and that are immersed in liquid helium for this purpose, the boiling point of which at standard pressure is 4.2 K. They are therefore contained in appropriate cryogenic tanks 10 (FIG. 2);
- a set 2 of windings produced by means of conventional (copper) conductors for producing gradients of the main field in three orthogonal directions in space x, y and z, the axis Oz generally being the direction of the main field. These field gradients are applied in accordance with specific sequences that make possible the spatial coding on which image construction is based. Magnetic resonance imaging entails establishing (or eliminating) very high currents (typically of hundreds of amps) in the gradient windings in very short time periods (of the order of around one hundred microseconds), or reversing very high currents, also in short-time periods, at frequencies close to 1 kilohertz (kHz), as in echo-planar imaging (EPI) sequences;
- one or more antennas 3 for transmitting and receiving radio-frequency signals for exciting and detecting precession of the nuclear magnetic moments in the area of interest at the frequency corresponding to the value of the local magnetic field, for example approximately 127.729 megahertz (MHz) for protons of water in a field of 3 teslas (T);
- electronic systems (amplifiers 24 to 26 for pulsed gradients, radio-frequency generators and detectors 31, etc.) and data processing systems 32 to 34 for sequence control and image reconstruction (see FIG. 4).

The conductors of the gradient windings 21 to 23 (FIG. 3) are subjected to the main magnetic field $\vec{B}_0$ and when a current flows in them are subject to a force perpendicular to the directions of the field and current known as the Lorentz (or Laplace) force. Since the time periods of establishing, eliminating, or reversing these currents are very short, real mechanical shocks are produced that are the source of the characteristic noise of MRI apparatus in operation.

If the main field is weak and the gradient pulses are fairly widely spaced, a tic tic tic sound is heard that is entirely tolerable. However, modern apparatus uses increasingly intense main fields (3 T in top-of-the-range clinical machines, 7 T in a few experimental machines, and up to around 12 T in machines under construction such as those referred to in reference [2]), with gradients that are also increasingly high, and with very "violent" imaging sequences (for example EPI sequences). The Lorentz forces to which the gradient windings are subjected then cause not only almost intolerable acoustic noise that can be frightening for patients, who must wear ear protection, but also mechanical vibrations liable to damage the gradient windings.

Reference [3] gives a summary of the recent state of the art. A very significant increase in cryogenic losses, i.e. helium boil-off, is also experienced (see reference [4]).

There are described below the structures of the cryogenic envelopes (cryostat 10) of a superconductive magnet and gradient windings 2 and the mechanisms that are operative in gradient winding-magnet interaction.

The components of the cryostat 10 are thin metal cylinders (a few millimeters thick for an inside diameter of approximately one meter and an outside diameter of two meters) connected by "domed" ends to constitute toroidal spaces of small substantially rectangular axial section (see FIGS. 5 and 6). Only the interior cylinders closest to the gradient windings have a significant role in the problem considered here. These components include, from the interior toward the exterior:
- the vacuum enclosure 102, most often made of stainless steel; it is in this cylinder at room temperature known as the "inside hole" or "tunnel" that the gradient generator system 2 is inserted;
- a thermal screen 103, generally made of aluminum, maintained at a temperature of approximately 80 kelvins (K);
- possibly a second thermal screen 104 also made of a material that is a good conductor of heat and maintained at approximately 20 K;
- the helium tank 105, also known as the "helium enclosure" or "cold box", most often made of stainless steel, which is at the boiling point of helium, which is 4.2 K at standard pressure, or lower for magnets operating at a lower temperature, for example in superfluid helium; and
- the former 101, generally made of aluminum alloy, supporting the superconductor windings 11, 12.

In the terminology of mechanical engineering, these thin cylindrical envelopes (of small thickness compared to the diameter and the length) are called "shells". If the materials that constitute them are isotropic, which they generally are, they are characterized from the mechanical point of view by their density $\rho$ and by two elastic constants, the modulus of elasticity or Young's modulus E and Poisson's ratio $\nu$. Mechanical calculations also use the Lamé coefficients:

$$\lambda = \frac{E\nu}{(1+\nu)(1-2\nu)}$$

$$\mu = \frac{E}{2(1+\nu)}$$

The coefficient $\mu$ is also called the shear or stiffness modulus and denoted G.

From the electrical point of view, these materials are characterized by their electrical conductivity $\sigma$.

Where the gradient windings are concerned, the simple structure is that of a z-gradient, the theoretical model of which is known as Maxwell turns, two circular turns on the axis Oz, of radius $a_0$, situated at the coordinates $$\pm b_0 = \pm \frac{a_0 \sqrt{3}}{2}$$

and carrying currents of equal and opposite magnitude ±I. They create in the area of interest in the vicinity of the origin O a gradient $$G_z = \frac{\partial B_z}{\partial z}$$

of the component $B_z$ of the substantially uniform field (the term linear is also used with reference to the variation of the field). These Maxwell turns are the equivalent of Helmholtz's turns for generating a uniform field. In practice, the conductors have finite sections and it must be possible to evacuate the heat caused by the Joule effect, which results in layers of current with a geometry appropriate for the production of a gradient having the required linearity (see for example patent FR 2 588 997, reference [5]).

The current pulses in the gradient windings induce currents in the surrounding conductors (in particular the envelopes of the cryostat), which currents are known as "eddy currents", and it is important to limit their influence. One of the most effective ways of doing this is to use active "screening" or "shielding" that entails producing a set of second opposite currents at a certain distance outside the first, but with the drawback of some additional bulk and the necessity of higher power for a specified gradient. Examples of this are found in reference [5]. The magnetic forces exerted by the main field on the z-gradient generator conductors tend either to increase or to reduce the winding radius, depending on the direction of the currents, which results in relatively simple vibration modes combining radial oscillations and longitudinal oscillations on the axis Oz.

The most common implementation of the windings producing gradients $$G_x = \frac{\partial B_z}{\partial x} \text{ or } G_y \frac{\partial B_z}{\partial y}$$

of the component $B_z$ of the magnetic field uses saddle-shaped conductors known as "Golay windings" (see FIG. 3). Reference [5] describes one practical implementation of this and, as for a z-gradient, screening can be effected as explained in patent FR 2 621 125 (reference [6]). Here the magnetic forces tend to curve the cylinders carrying the current layers into banana shapes and the corresponding oscillation modes are more complex than those for the z-gradients.

The main object of the present invention is not to reduce these vibrations specific to the gradient windings: moreover, an alternative design for this purpose is proposed in reference [1]. The present invention is essentially addressed to reducing the eddy currents and vibrations that the gradient windings induce in the envelopes of the cryostat and that are now recognized as one of the major causes of acoustic noise and cryogenic losses.

The mechanism of gradient-magnet interaction is clearly analyzed in qualitative terms in U.S. Pat. No. 6,707,302 (reference [7]) and U.S. Pat. No. 7,514,928 (reference [8]), which proposes arrangements internal to the cryostat that are capable of reducing the harmful effects.

Another approach to reducing eddy currents and their harmful consequences is proposed in U.S. Pat. Nos. 7,141, 974 and 7,375,526 (reference [9]) by adding passive screening to active screening as already known in itself (see reference [6], for example), which passive screening is added by means of an additional envelope made of a material such as copper that is a good conductor. The resulting improvement does not prove sufficient in practice, however.

Besides, quantitative modeling is therefore necessary for a better understanding of the effect of the various parameters and for deducing practical arrangements from them.

The cryostat-gradient windings system is governed by mechanical and electromagnetic partial differential equations. In the absence of a main field $\vec{B_0}$, these two sets of equations would be independent and it is their coupling via the main field that significantly complicates the problem.

One way to write the mechanical equations is in the Lamé vectorial form:

$$(\lambda + 2\mu)\overrightarrow{grad}\,div\vec{U} - \mu\overrightarrow{rot rot}\vec{U} + \vec{F} = \rho\frac{d^2\vec{U}}{dt^2}$$

where $\vec{U}$ is the displacement vector at the point concerned and $\vec{F}$ is the force density per unit volume. In the absence of the main field, this density would be reduced to weight, the influence of which on this problem is of no importance, except for determining the dimensions of the supports of the various components, but if the main field exists and if there are induced currents with a density $\vec{J}$ per unit volume, then there is a coupling term with the electromagnetic equations:

$$\vec{F} = \vec{J} \times \vec{B_0}$$

The other mechanical equations, which are not explained here, relate to the conditions at the limits of the surfaces of the various components, in particular at the ends of the cylindrical tubes constituting the envelopes.

In the same way as for the mechanical equations, the electromagnetic equations can be written in several ways, for example in the well-known differential form of Maxwell equations or the following integral form:

$$\vec{J_M} = \sigma\left(-\frac{\partial \vec{A_M}}{\partial t} + \vec{E'_M} + \frac{d\vec{U_M}}{dt} \times \vec{B_0}\right)$$

$$\vec{A_M} = \vec{A_{0M}} + \vec{A'_M}$$

$$\vec{A'_M} = \frac{\mu_0}{4\pi}\iiint \frac{\vec{J_P}}{|\vec{PM}|}d\tau_P$$

$$\vec{E'_M} = \frac{1}{4\pi\varepsilon_0}\iiint \frac{Q_P\vec{PM}}{|\vec{PM}|^3}d\tau_P$$

$$div\vec{J} + \frac{\partial Q}{\partial t} = 0$$

In the above equations, $\vec{J_M}$ is the density of the eddy currents at any point M of each of the envelopes, $\vec{U_M}$ is the displacement vector, and $\vec{A_M}$ is the magnetic potential vector at the same point. This is the sum of the vector potential $\vec{A_{0M}}$ created by the currents in the gradient windings or excitation potential and the vector potential $\vec{A'_M}$ created at the point M by all of the eddy currents, the integral of the third equation being extended to the whole of the volume of the conductive envelopes, P designating the current point thereof. $Q_P$ is the electric charge density per unit volume at any point P and $\vec{E'_M}$ is the electric field created by this distribution of charges at the point M, with $\mu_0 = 4\pi \times 10^{-7}$ S.I. and $\epsilon_0 \mu_0 c^2 = 1$ where c is the speed of light in a vacuum. The last equation is valid at all points and expresses the conservation of electrical charge. To avoid complication, the last two of the above equations are given in their generic form with charge densities per unit volume. In reality, the charge densities are primarily surface densities, which transform the volume integral of the penultimate equation into a surface integral, while the final equation is transformed into a condition at the limits of the surfaces of the conductors. These equations would be the well-known equations of the induced current problem if, in the first equation, the term $$\frac{d\vec{U_M}}{dt} \times \vec{B_0}$$

for coupling with the mechanical equations via the main field were absent.

These equations are in fact approximate equations that ignore the so-called displacement current, which approximation is totally justified if the dimensions of the system (here of the order of one meter) are small compared to the distance traveled by light in a time characteristic of variation in the system (here the rise time of the gradient pulses, which gives <<300 m for 1 microsecond (µs)). This approximation is well known in electromagnetism under the name quasi-stationary state or quasi-permanent regime approximation. Solving these systems of equations calls on various methods covered by an abundant literature (finite elements, boundary elements, moments method, spectral or pseudo-spectral methods, etc.).

The response of the system to a gradient pulse of any shape is not what is directly looked for, but rather the response to sinusoidal excitation at an angular frequency $\omega = 2\pi f$. The equations being linear, the response to excitation of any shape is obtained by superposing the responses to its Fourier components.

Although there is a superposition theorem for displacements and for current and charge densities, the dissipated powers that are expressed by means of the square of the current densities must be calculated after the current densities have been summed if the excitation is not purely sinusoidal.

The phenomena observed are dominated by the vibration modes of the various shells present. The vibration of the shells constitutes a field that has been studied extensively, notably in aeronautics (aircraft, rockets, etc.) and in shipbuilding (submarines, etc.). Information on this subject can be found in references [10] and [11].

Consider by way of a simplified model the example of a single cylindrical shell with axis Oz, mean radius a, thickness e, and length 2 b. It is immersed in a uniform main field $\vec{B_0} = B_0 \vec{u_z}$ and excited sinusoidally at the angular frequency $\omega$ by a z-gradient schematically represented by two Maxwell turns that are symmetrical relative to the median plane xOy of the cylinder and that produce a gradient of amplitude $G_0$ at the origin.

The possible vibration modes for a cylindrical shell can be very complicated but the simplest mode, known as the "respiratory" mode, is a purely radial vibration of angular frequency (which frequency is then substantially independent of thickness) that is given for a thin cylinder of mean radius a by the following expression:

$$\omega_0 = 2\pi f_0 = \frac{1}{a}\sqrt{\frac{E}{\rho(1-v^2)}}$$

The corresponding period $$\tau_0 = \frac{1}{f_0}$$

is substantially the time that an acoustic wave would take to travel the circumference of the cylinder. To be more precise, it is a time intermediate between the times taken by the two types of wave liable to propagate in a solid, namely longitudinal or compression waves, which are faster, and transverse or shear waves, which are slower.

All vibration modes that can be excited in the situation concerned have frequencies that are deduced from this characteristic frequency and they remain of the same order of magnitude.

The situation is characterized by three length scales, the radius a of the cylinder, its thickness e, and the skin thickness characteristic of the distribution of the eddy currents at the frequency concerned:

$$\delta = \sqrt{\frac{2}{\mu_0 \sigma \omega}}$$

notably the skin thickness $\delta_0$ at the frequency $\omega_0 = 2\pi f_0$ characteristic of the material of the cylinder. For usual materials, this frequency $f_0$ is always of the order of 1000 hertz (Hz) to 2000 Hz for cylinders with a mean diameter equal to 1 m:

| | |
|---|---|
| Aluminum | 1704.6 Hz |
| Copper | 1341.2 Hz |
| Stainless steel | 1559.9 Hz |

The solution of the problem would be simple if the following condition were satisfied:

$$e << \delta << a$$

but unfortunately this is not so for the materials concerned: e and $\delta_0$ are of the same (millimetric) order of magnitude. The distribution of the eddy currents within the thickness of the envelope, here of the cylinder, which is not uniform and strongly dependent on the frequency and the coupling via $\vec{B_0}$, is then an essential element of the solution. The following description does not give the solution in detail (current distribution, displacement components, etc.) but rather only the power dissipation in the whole of the cylinder as a function of frequency ("power spectrum"). Vibration, acoustic noise and dissipated power are in fact linked, and reducing the amount of power that is dissipated reduces all of them concomitantly.

By way of example, FIG. 13 shows the spectrum of the dissipated power P in watts (W) as a function of the frequency f in Hz, when exciting a copper cylinder with the following characteristics:

a=0.45 m,
b=1 m,
e=5 millimeters (mm),
$\rho$=8960 kilograms per cubic meter (kg/m$^3$),
E=138 giga pascals (GPa),
$\nu$=0.364,
$f_0$=1490.244 Hz,
$\sigma$=58 mega siemens per meter (MS/m) (100% IACS), and
$\delta_0$=1.712 mm The cylinder is simply supported and its ends are totally free. The Maxwell turns have a radius $a_0$=0.3 m and produce a gradient of amplitude $G_0$=100 milliteslas per meter (mT/m) in a main field $B_0$=11.75 T.

The person skilled in the art has available all of the data necessary for verifying these results by methods of their choice.

However, even in a configuration that is this simple both for description and for calculation (the eddy current lines are circles about the axis Oz and the current density $\vec{J}$ is reduced to its azimuth component, the charge densities per unit volume are identically zero and the displacement vector $\vec{U}$ has a radial component and an axial or longitudinal component, its azimuth component being zero), the spectrum is complicated with a very pronounced peak in the vicinity of 1080 Hz (see curve A10 in FIG. 13).

The theory of thin cylindrical shells gives the exact analytical expression of the natural frequencies for such a configuration if the cylinder is closed by respective end walls at both ends, which end walls prevent radial movement and allow axial movement. These frequencies are solutions of the equation:

$$\Omega^4 - \Omega^2\left\{1 + \left(\frac{m\pi a}{2b}\right)^2\left[1 + \frac{1}{12}\left(\frac{m\pi e}{2b}\right)^2\right]\right\} + \left(\frac{m\pi a}{2b}\right)^2\left[1 - \nu^2 + \frac{a^2 e^2}{12}\left(\frac{m\pi}{2b}\right)^4\right] = 0$$

in which $$\Omega = \frac{\omega}{\omega_0}$$

and m is an integer. The frequencies are similar for free ends. For example, the peaks at the frequencies close to 2205 Hz and 4250 Hz correspond to m=2 and m=4, respectively.

The dissipated powers are considerable, which shows the need for active screening of the gradient windings.

The calculation is effected in the context of linear elasticity, i.e. for oscillations of small amplitude. The values obtained from such calculations are therefore essentially theoretical, and non-linear phenomena going as far as rupture will occur well before they are reached.

The values obtained are proportional to the square of the amplitude of the gradient concerned and they are increasing functions of the main field.

Consider now a real system with a cryostat comprising four envelopes 102 to 105 like that in FIGS. 5 and 6 and a winding former 101, the main field of which is 7 T; FIG. 7 shows the respective spectra A101, A102, A103, A104, A105 of the respective powers dissipated in each of these envelopes or formers 101 to 105 when they are loaded by a carefully screened z-gradient of amplitude 50 mT/m: this screening is never perfect and this example corresponds to the screening performance of the best commercially-available gradient windings. The spectrum of the power dissipated in the cold box 105 and the former 101 corresponds to the source of helium boil-off.

The x-gradients or y-gradients yield similar results with peaks with slightly different shapes and frequency positions because the vibration modes excited are also different.

Acoustic noise is caused essentially by vibrations of the stainless steel first envelope 102 (curve A102) and helium losses are caused by the energy dissipated primarily in the fourth envelope (cold box 105-curve A105), the power dissipated in the winding former 101 (curve A101) being significantly lower.

It is seen that it is practically impossible for a gradient pulse or an EPI sequence not to have a Fourier component that excites part of the spectrum, inducing significant power dissipation and strong vibrations accompanied by acoustic noise. The fundamental frequency of the EPI sequences routinely used is approximately 600 Hz to 700 Hz, and the strongest harmonic is the third harmonic, i.e. 1800 Hz to 2100 Hz, which falls in the portion of the spectrum thus must be avoided at all costs. This situation has been clearly demonstrated experimentally (see reference [12]).

U.S. Pat. No. 6,707,302 and U.S. Pat. No. 7,514,928 (references [7] and [8]) propose modifying the envelopes of the cryostat to reduce the vibration thereof and its consequences. These modifications are in competition with other mechanical or cryogenic imperatives and their effects are not guaranteed a priori. It is moreover very difficult if not impossible to modify anything at all once the magnet has been constructed and the cryostat closed.

The solution proposed by U.S. Pat. No. 7,375,526 (reference [9]) entails inserting a cylinder between the gradient windings and the interior cylinder of the cryostat, which cylinder is made of a material, such as copper, that is a very good electrical conductor.

Inserting a 10 mm thick copper cylinder in the above-described cryostat system yields the FIG. 8 spectrum in which the additional curve A106 is the spectrum of the power dissipated in the copper cylinder. There is a significant improvement, but the highly damaging peaks at around 1000 Hz-1500 Hz have not disappeared.

DEFINITION AND SUBJECT MATTER OF THE INVENTION

The present invention aims to remedy the drawbacks referred to above and to reduce to a greater degree the acoustic noise and cryogenic losses in magnetic resonance imaging apparatus simply and at relatively low cost without it being necessary to modify the design of the apparatus as a whole.

The invention achieves these aims by means of a magnetic resonance imaging system with reduced cryogenic losses and acoustic noise, the system including means for creating an intense main magnetic field $\vec{B_0}$ in a usable interior space in the form of a tunnel with axis Z, means for radio-frequency excitation and processing of radio-frequency signals emitted in response by a body or object placed in said usable interior space, a set of solenoid gradient windings for superposing on the intense magnetic field $\vec{B_0}$ components of an additional magnetic field, said gradient windings being placed in a cylindrical annular space situated between an exterior cryogenic enclosure containing said means for creating an intense magnetic field $\vec{B_0}$ and said usable interior space, and electronic control circuits, the toroidal exterior cryogenic enclosure including concentrically a vacuum enclosure defining a cylindrical interior space at room temperature in which there is placed the set of solenoid gradient windings, at least one thermal screen maintained at a temperature in the range 20 K to 80 K, a cold box at a temperature less than 5 K, and a former for supporting the means for creating an intense main magnetic field $\vec{B}_0$, wherein the exterior cryogenic enclosure further includes at least one additional envelope placed between the set of solenoid gradient windings and the vacuum enclosure, the additional envelope being made of a conductive material with electrical resistivity greater than or equal to $7 \times 10^{-8}$ ohm meters ($\Omega \cdot m$) and having a characteristic frequency less than or equal to the characteristic frequencies of each of the other components of the exterior cryogenic enclosure.

The additional envelope is advantageously made of lead.

The additional envelope can equally be made of an alloy of lead and at least one of the following elements: tin, bismuth, cadmium, or of tin or tin alloy.

In a first possible embodiment, to avoid any direct transmission of vibration, the additional envelope includes an intermediate tube that is not mechanically connected to the set of solenoid gradient windings or to the vacuum enclosure.

In another possible embodiment, the additional envelope includes an intermediate tube that is mechanically connected to the set of solenoid gradient windings.

In a further possible embodiment, the additional envelope includes an intermediate tube that is mechanically connected to the vacuum enclosure.

The additional envelope may then include an intermediate tube that is mechanically connected to the vacuum enclosure by gluing or welding.

The vacuum enclosure is advantageously made of stainless steel.

In one particular embodiment, the cryogenic enclosure includes a first thermal screen maintained at a temperature less than or equal to 80 K and a second thermal screen maintained at a temperature less than or equal to 20 K.

The thermal screen or screens are advantageously made of aluminum or aluminum alloy.

The cold box is advantageously made of stainless steel.

The former may be made of aluminum or aluminum alloy.

For example the additional envelope includes a tubular structure having a mean radius in the range 0.4 m to 0.5 m, a thickness in the range 8 mm to 12 mm, and a length in the range 2 m to 4 m.

The system may include two or three concentric additional envelopes having the features defined above.

The invention also provides a method of reducing acoustic noise and cryogenic losses in a magnetic resonance imaging system including means for creating an intense main magnetic field $\vec{B}_0$ in a usable interior space in the form of a tunnel with axis Z, means for radio-frequency excitation and processing of radio-frequency signals emitted in response by a body or object placed in said usable interior space, a set of solenoid gradient windings for superposing on the intense magnetic field $\vec{B}_0$ components of an additional magnetic field, said gradient windings being placed in a cylindrical annular space situated between an exterior cryogenic enclosure containing said means for creating an intense magnetic field $\vec{B}_0$ and said usable interior space, and electronic control circuits, the toroidal exterior cryogenic enclosure including concentrically a vacuum enclosure defining an interior cylindrical space at room temperature in which there is placed the set of solenoid gradient windings, at least one thermal screen maintained at a temperature in the range 20 K to 80 K, a cold box at a temperature less than 5 K, and a former for supporting the means for creating an intense main magnetic field $\vec{B}_0$, wherein the method includes the step of inserting in the exterior cryogenic enclosure at least one additional envelope placed between the set of solenoid gradient windings and the vacuum enclosure, the additional envelope being made of a conductive material with electrical resistivity greater than or equal to $7 \times 10^{-8}$ $\Omega \cdot m$ and having a characteristic frequency less than or equal to the characteristic frequencies of each of the other components of the exterior cryogenic enclosure.

Thus the invention addresses the necessity for the additional envelope inserted between the gradient windings and the interior tube of the cryostat (or the successive envelopes inserted as a function of the space available):

to have a characteristic frequency $f_0$ as different as possible from the characteristic frequencies of the envelopes present in the cryostat, which is not true of the usual good conductors such as copper as recommended by reference [9];

to be a rather poor conductor, so as not to carry high eddy currents, which goes entirely against the teachings of reference [9].

BRIEF DESCRIPTION OF THE DRAWINGS

Other features and advantages of the invention emerge from the following description of particular embodiments of the invention given with reference to the appended drawings, in which.

DETAILED DESCRIPTION OF PREFERRED EMBODIMENTS

Figure 1:
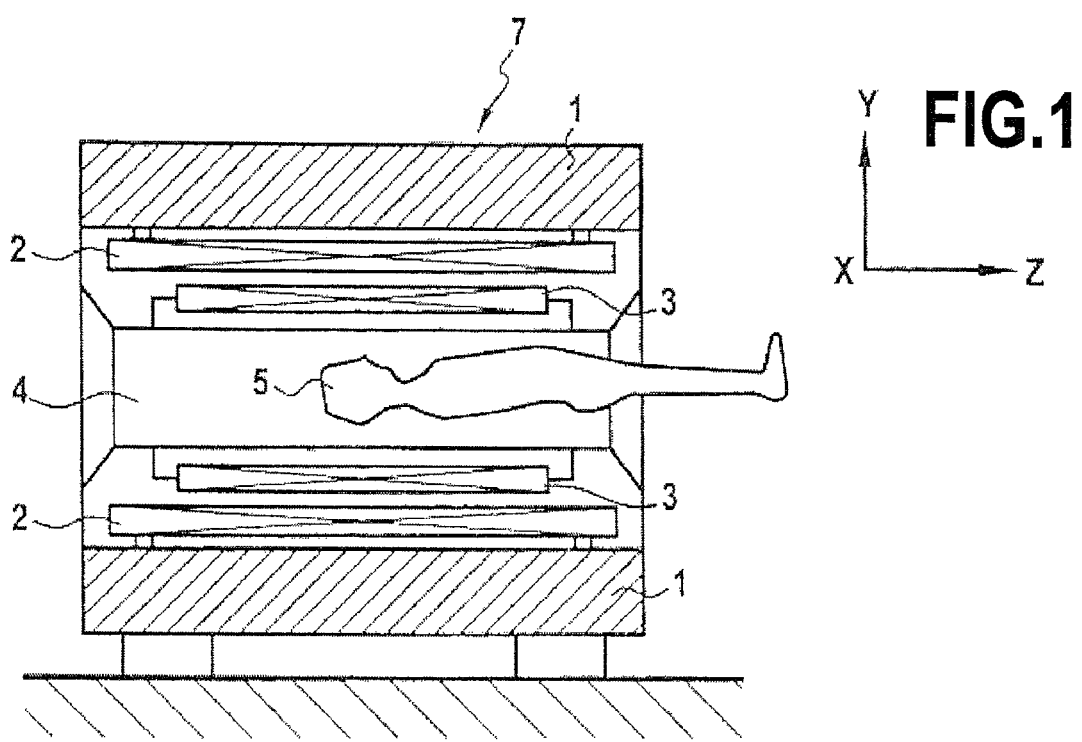
FIG. 1 is a diagrammatic view in axial section of an example of magnetic resonance imaging apparatus to which the invention is applicable.
Figure 2:
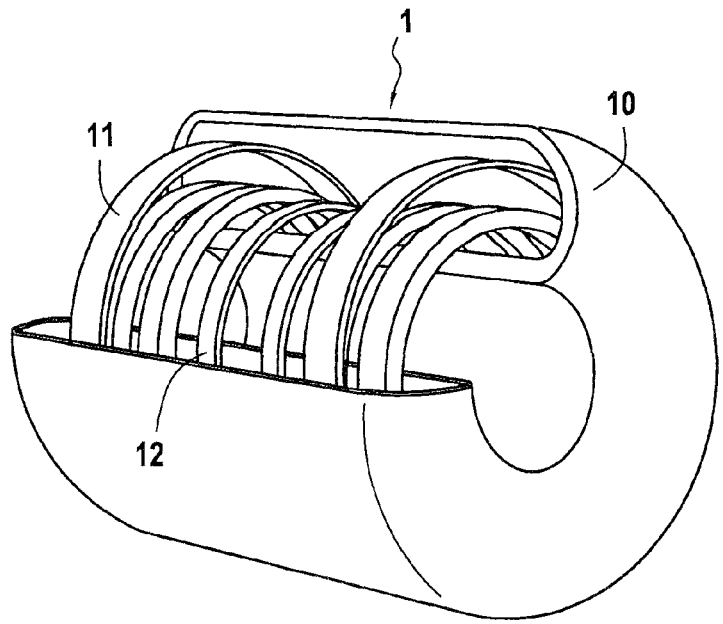
FIG. 2 is a cut-away diagrammatic perspective view showing an example of a cryostat usable in magnetic resonance imaging apparatus such as that from FIG. 1.

The invention applies to magnetic resonance imaging systems 7 such as those described above with reference to FIGS. 1 to 6 that use a cryostat 10 including a vacuum enclosure 102 at room temperature, for example made of stainless steel, containing a gradient generator system 2, at least one thermal screen 103, 104 made of a material that is a good conductor of heat, such as aluminum, and a cold box 105, for example made of stainless steel, which is at the boiling point of helium, which is 4.2 K.

The envelopes 102 to 105 are concentric. The cold box 105 incorporates a former 101, for example made of aluminum alloy, supporting superconductor windings constituting the magnet 1 that creates a main magnetic field.

Figure 3:
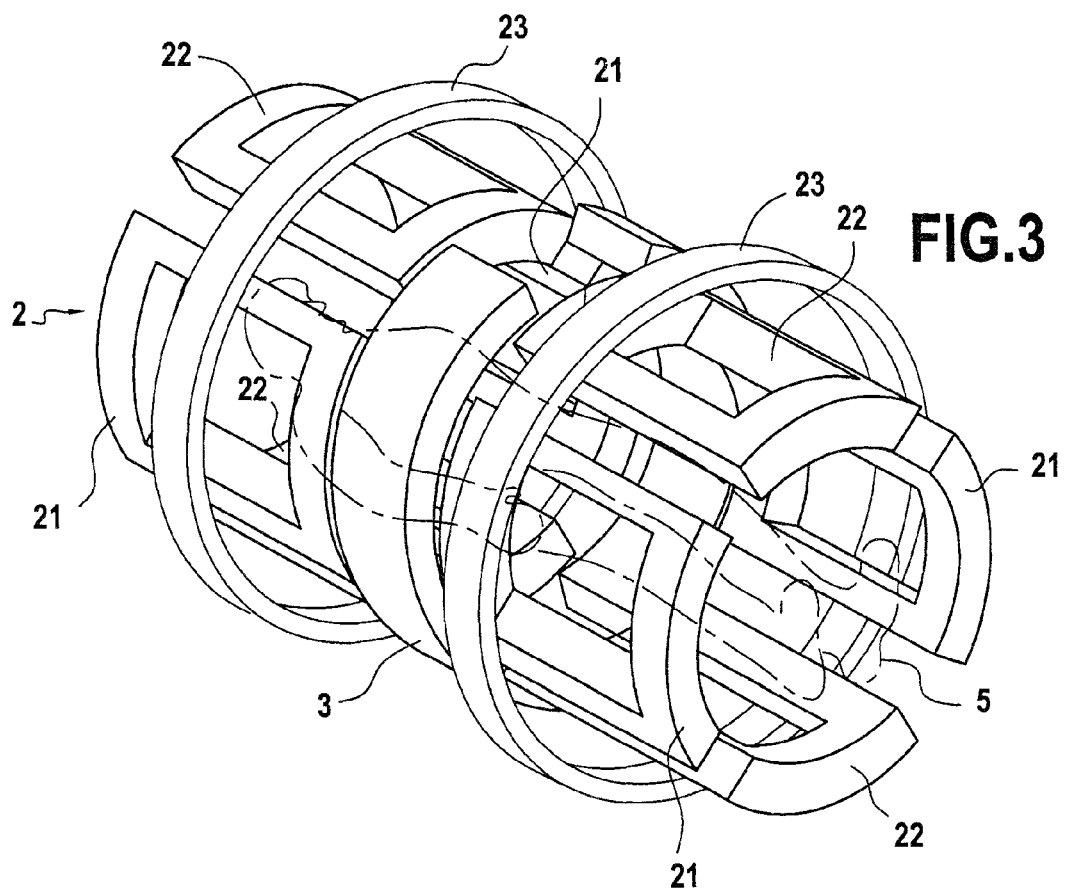
FIG. 3 is a diagrammatic perspective view of a set of gradient windings usable in apparatus such as that from FIG. 1.
Figure 4:
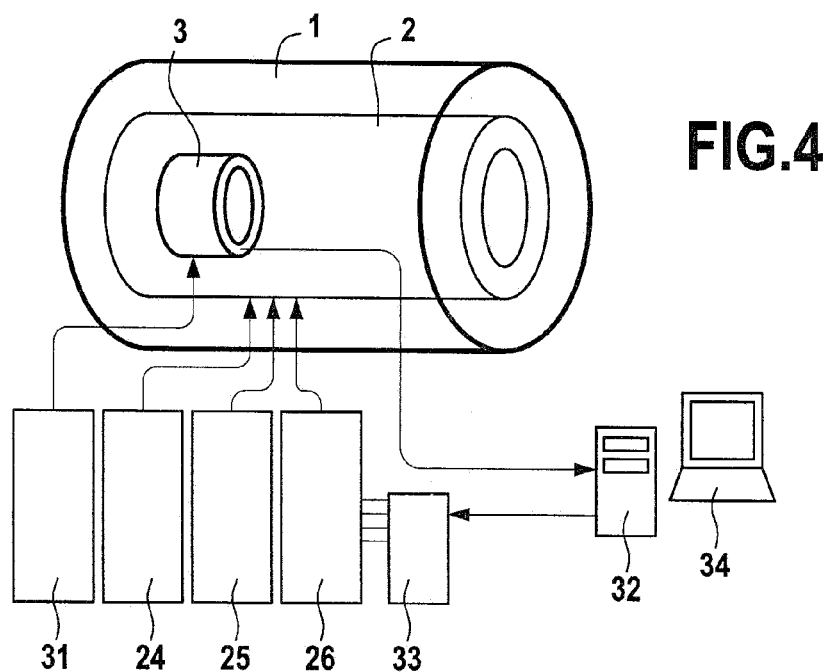
FIG. 4 is a diagrammatic view of electronic and data processing control devices associated with MRI apparatus.

The gradient generator system 2, which interacts with the cryostat 10, can be produced as shown diagrammatically in FIG. 3 with gradient windings 21 in a direction X, gradient windings 22 in a direction Y perpendicular to the direction X, and gradient windings 23 in a direction Z perpendicular to the directions X and Y and aligned with the axis of the imaging apparatus. This gradient generator system 2 is not described again.

Figure 5:
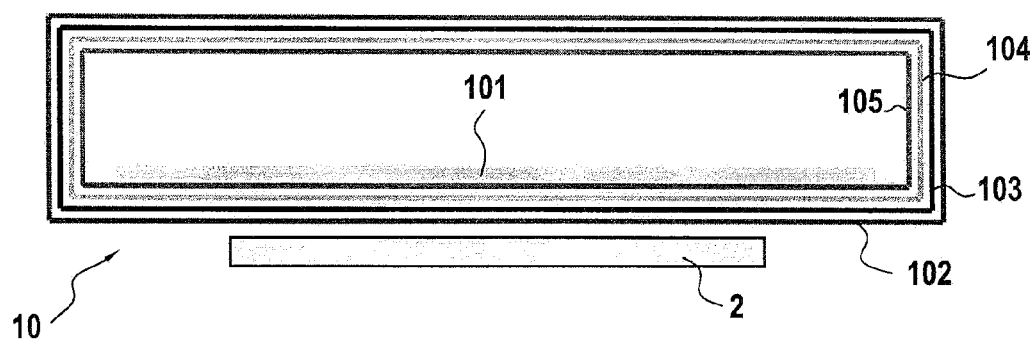
FIG. 5 is a diagrammatic view in axial half-section of a known example of a cryostat usable in MRI apparatus.
Figure 6:
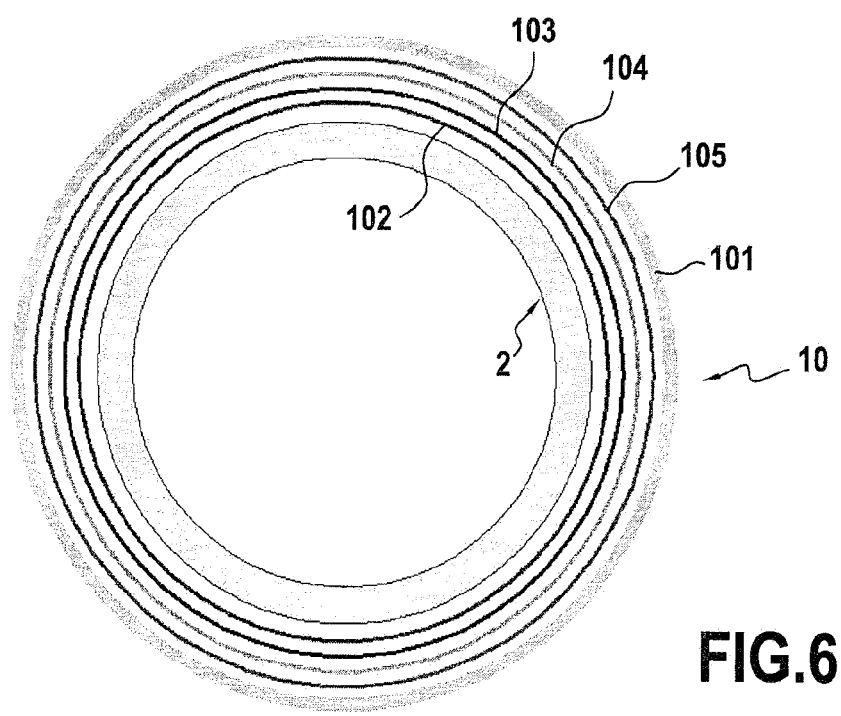
FIG. 6 is a cross-section of the cryostat from FIG. 6.

The various components 102 to 105 constituting the cryostat 10 are metal cylinders that are thin (having a thickness of a few millimeters for a diameter of approximately one meter on the inside and a diameter of two meters on the outside) and are connected by domed ends to constitute toroidal spaces of small substantially rectangular axial section (see FIG. 5). Such envelopes constitute shells at different temperatures.

Figure 9:
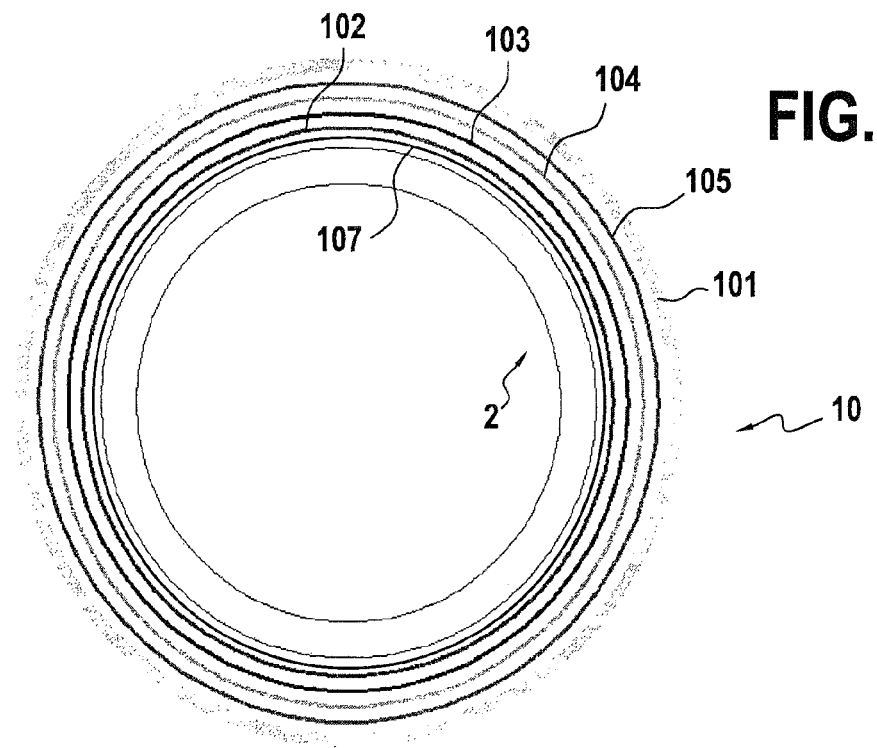
FIG. 9 is a diagrammatic view in cross-section of a first example of a cryostat usable in magnetic resonance imaging apparatus of the invention, with an additional envelope that is mechanically free.

For example, FIG. 9 shows a vacuum enclosure 102 at room temperature, a first thermal screen 103 at a temperature of approximately 80 K, a second thermal screen 104 at a temperature of approximately 20 K, and a helium reservoir or cold box 105 at the boiling point of helium, which is 4.2 K. The former 101 and the superconductor windings constituting the magnet 1 are also at the boiling point of helium.

According to the invention, there is inserted between the gradient generator system 2 and the interior cylinder 102 of the cryostat 10 at least one additional cylindrical envelope 107 that:

has a characteristic frequency $f_0$ as different as possible from the characteristic frequencies of the other envelopes 102 to 105 present in the cryostat, which is not true of the usual good conductors such as copper as recommended by reference [9];

is a rather poor conductor, so as not to carry high eddy currents, which also goes against the teachings of reference [9].

A plurality of successive additional envelopes having the same properties can be inserted, for example two or three additional envelopes 107, as a function of the space available. However, a single envelope already provides a considerable benefit and does not entail modifying the entire pre-existing structure of the cryostat.

To address the first of the characteristics required for the additional envelope 107, the above expression for $f_0$ shows that it is necessary to use materials with a low Young's modulus and a high density or vice-versa. The characteristic frequencies for 1 m diameter cylinders are as follows:

| Beryllium | 3968.8 Hz |
| Lead | 421.0 Hz |
| Tin | 892.3 Hz |
| Uranium | 1080.8 Hz |

The first two materials have the most "abnormal" frequencies but the toxicity of beryllium and its compounds in practice rules out their use. This material must therefore be excluded. Moreover, its resistivity of $4 \times 10^{-8}$ Ω·m would be too low to satisfy the second criterion. In contrast, lead is entirely appropriate, with its relatively high resistivity of $21 \times 10^{-8}$ Ω·m and offering the possibility of "adjusting" both the characteristic frequency and the resistivity to their optimum values by producing alloys of lead with tin, bismuth, or cadmium in particular. Examples of the properties of lead alloys are given in references [13] and [14], for example.

Alternatively, the additional envelope 107 can be made of tin, which has a characteristic frequency of 892.3 Hz for a 1 m diameter cylinder and a resistivity of $10 \times 10^{-8}$ Ω·m. Otherwise, depleted uranium is difficult to use and has a characteristic frequency that is too high (1080.8 Hz for a 1 m diameter cylinder).

In the FIG. 9 embodiment, a tubular additional intermediate envelope 107 is used that, in order to prevent direct transmission of vibration, is not mechanically connected to the gradient generator system 2 or to the vacuum enclosure 102 of the cryostat.

Figure 7:
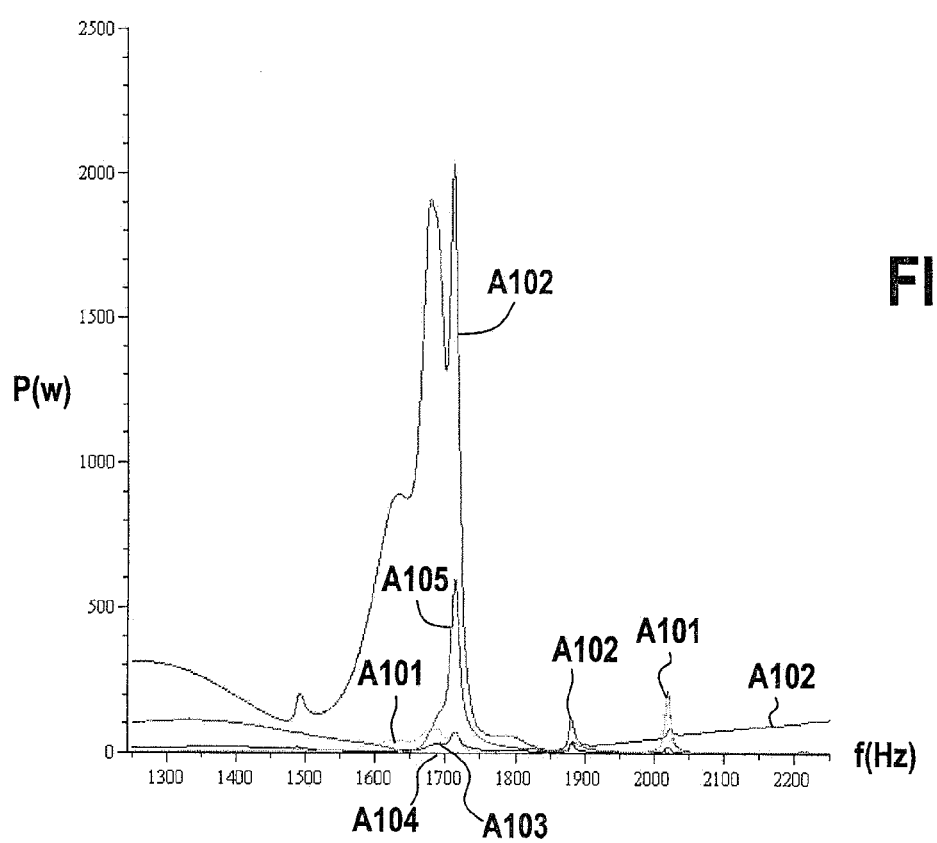
FIG. 7 shows curves of power spectrum as a function of frequency for various components of the cryostat from FIGS. 5 and 6.
Figure 8:
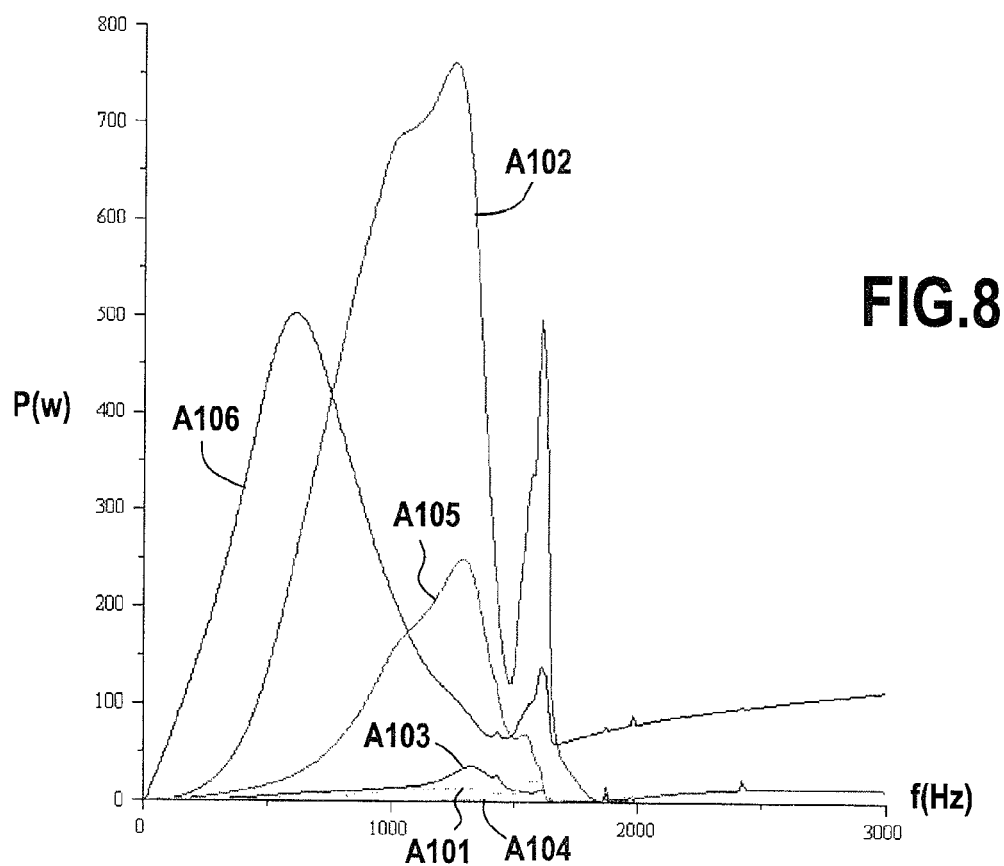
FIG. 8 shows curves of power spectrum as a function of frequency for various components of the cryostat from FIGS. 5 and 6 to which has been added a cylinder of a material that is a very good conductor of electricity, such as copper.

For example, the additional intermediate envelope 107 can consist of a cylinder of ordinary lead with the following dimensions: mean radius 0.44 m, thickness 10 mm, length 3.6 m. This yields the FIG. 10 energy dissipation spectra, which show a spectacular reduction in the harmful effects of the gradients and in particular the disappearance of the peaks in the vicinity of 1000 Hz to 1500 Hz relative to prior art apparatus with no additional envelope (FIG. 7) or with a cylindrical envelope made of a material that is a very good conductor, such as copper (see FIG. 8 and the curve A106 corresponding to the spectrum of the power dissipated in a copper cylinder).

Figure 10:
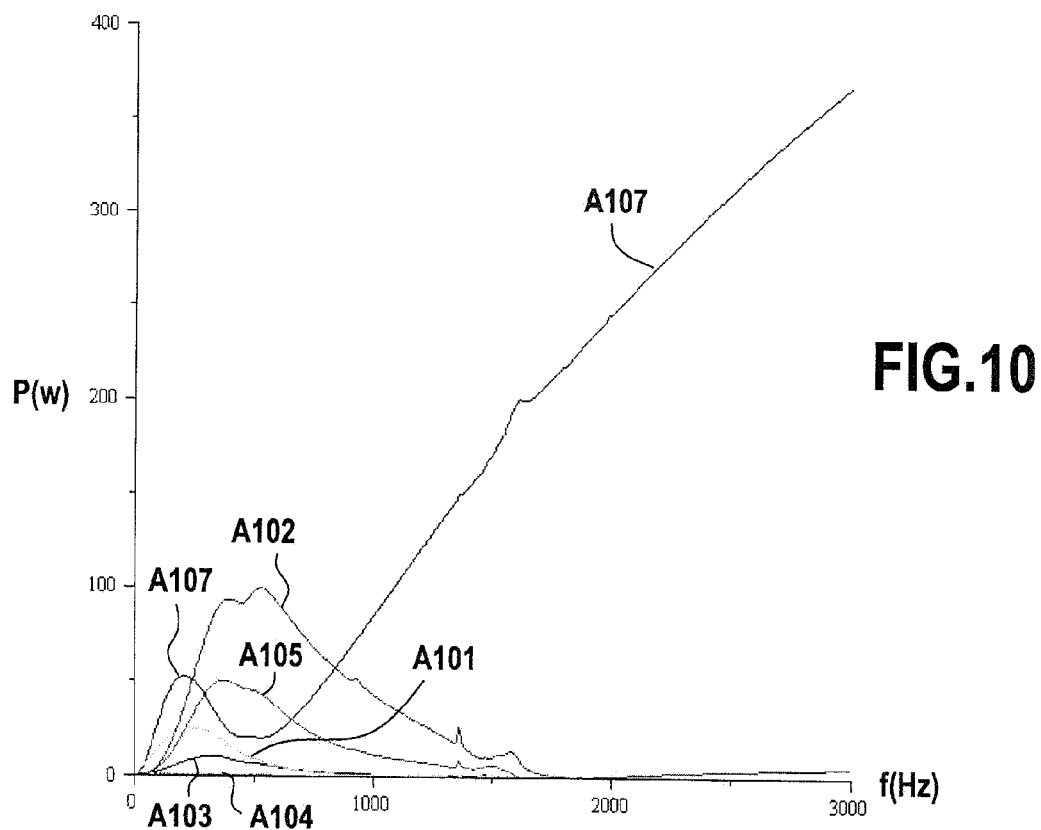
FIG. 10 shows curves of power spectrum as a function of frequency for various components of the cryostat from FIG. 9.

In FIG. 10, the curve A107 is the spectrum of the power dissipated in the lead cylinder 107. This power spectrum A107 shows that the power dissipated in the lead cylinder 107 remains below approximately 200 W up to a frequency of the order of 1700 Hz but produces a drastic power reduction for all the power spectra A101 to A105 of the other envelopes 101 to 105.

In particular, the power spectrum A102 linked to the first stainless steel envelope 102, which is usually the main cause of acoustic noise, has a peak of the order of only 100 W at around 500 Hz, whereas in a prior art system with no additional envelope (see FIG. 7), this peak is in the range 1300 to 2000 W at around 1700 Hz, and even with the insertion of a copper conductive envelope as taught by reference [9] (see FIG. 8), there is still a peak of the order of 750 W at around 1200 Hz.

In the same way, with a system of the present invention, by means of the presence of an additional cylindrical envelope made of lead, the dissipation peak of the power spectrum A105 of the cold box 105 (see FIG. 10) is no more than approximately 50 W at a frequency of the order of 400 Hz, whereas in a prior art system with no additional envelope (see FIG. 7) this peak is of the order of 600 W at around 1700 Hz, and even with the insertion of a conductive envelope made of copper as taught by reference [9] (see FIG. 8), there is still a peak of the order of 250 W at around 1300 Hz.

The higher the electrical resistivity of the additional envelope 107, the better the results, but obviously this must not be taken as far as choosing an insulative material, which would have no effect. This means that for a given machine (gradient windings and cryostat) there is an optimum choice for the combination ($f_0$, σ) from among the materials available. The length and thickness of the cylinder 107 can equally be adjusted to obtain the best results for given a gradient generator system and a given cryostat.

As a general rule, for standard MRI systems, the additional envelope 107 can comprise a tubular structure having a mean radius in the range 0.4 m to 0.5 m, thickness in the range 8 mm to 12 mm, and a length in the range 2 m to 4 m.

Figure 11:
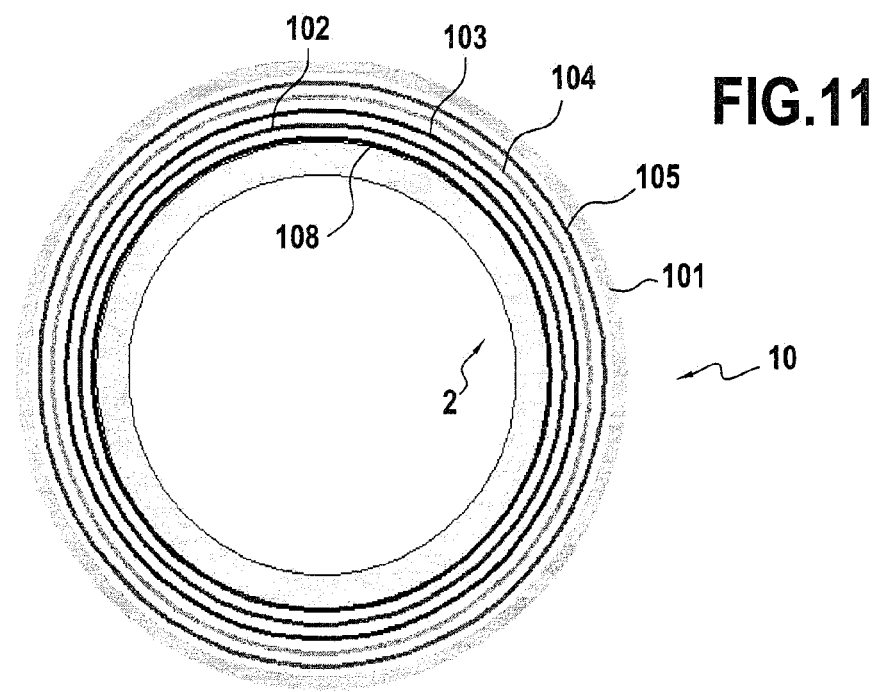
FIG. 11 is a diagrammatic view in cross-section of a second example of a cryostat usable in magnetic resonance imaging apparatus of the invention with an additional envelope mechanically connected to a set of gradient windings.

The FIG. 9 embodiment uses an intermediate tube 107 that is not mechanically connected to the gradient generator system 2 or to the cryostat 10. This is to prevent direct transmission of vibration. However, in another possible embodiment, a cylinder 108 of lead or equivalent material can be mechanically connected to the set 2 of gradient windings to modify and above all reduce their natural vibration (FIG. 11).

Figure 12:
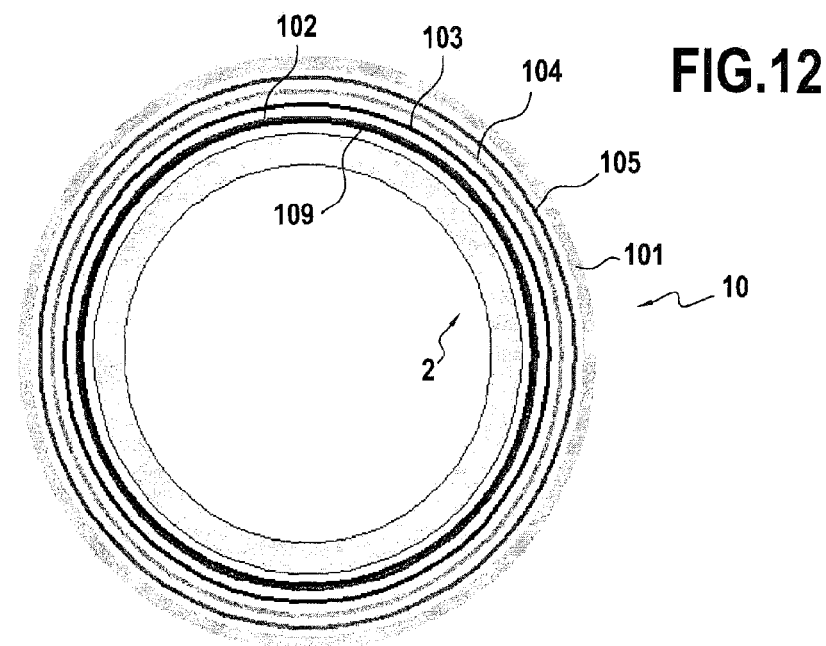
FIG. 12 is a diagrammatic view in cross-section of a third example of a cryostat usable in magnetic resonance imaging apparatus of the invention with an additional envelope mechanically connected to a vacuum enclosure.
Figure 13:
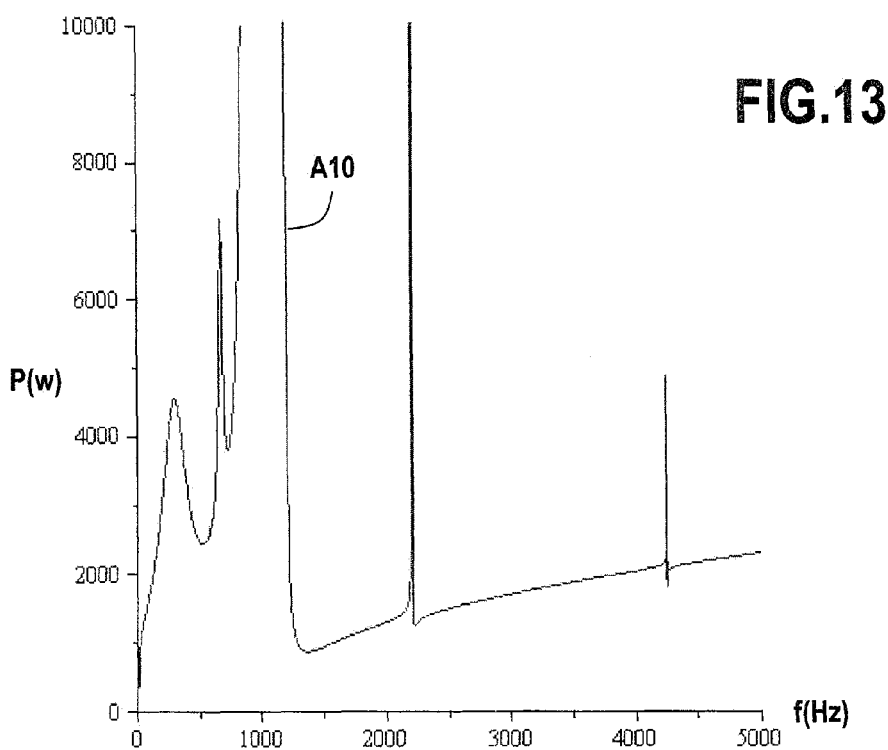
FIG. 13 shows a curve of power spectrum as a function of frequency for a theoretical example including a copper cylinder.

A cylindrical layer 109 of lead or equivalent material can also be mechanically connected (for example glued or welded) to the interior tube 102 of the cryostat 10 to modify its vibrational properties (FIG. 12).

For a given gradient generator system 2 and a given cryostat 10, it is possible to determine the best configuration including one or more lead cylinders 107, 108, or 109, whether or not they are mechanically connected to the gradient generator system 2 or to the interior tube 102 of the cryostat 10, by modeling using the methods referred to above.

A preferred embodiment remains one with a mechanically free intermediate tube 107 made of lead or lead alloy having a characteristic frequency $f_0$ that is as low as possible and electrical resistivity that is at least as high as that of lead.

An embodiment with an intermediate tube made of tin or tin alloy constitutes an alternative solution offering slightly reduced performance but nevertheless achieving a significant improvement in terms of reducing acoustic noise and cryogenic losses compared to embodiments using tubes made of copper or other materials that are very good conductors of electricity.

REFERENCES CITED

[1] Patent EP 1 952 170, Guy Aubert.
[2] *The Whole Body 11.7 T MRI Magnet for Iseult/INUMAC Project*, Vedrine, P.; Aubert, G.; Beaudet, F.; Belorgey, J.; Beltramelli, J.; Berriaud, C.; Bredy, P.; Chesny, P.; Donati, A.; Gilgrass, G.; Grunblatt, G.; Juster, F. P.; Molinie, F.; Meuris, C.; Nunio, F.; Payn, A.; Quettier, L.; Rey, J. M.; Schild, T.; Sinanna, A., IEEE Transactions on Applied Superconductivity, vol. 18, no. 2, pp. 868-873, June 2008.
[3] *MRI Acoustic Noise: Sources and Mitigation*, William A. Edelstein, ISMRM High Field Workshop, Mar. 25-28, 2007.
[4] *Problems of measurement of the helium boil off rate of tomographic magnets*, Pavel Hanzelka & Jaroslav Horky, Cryogenics 39, pp. 647-649, 1999.
[5] Patent FR2588997, Guy Aubert.
[6] Patent FR2621125, Guy Aubert.
[7] U.S. Pat. No. 6,707,302, Guenter Riess.
[8] U.S. Pat. No. 7,514,928, Michael Westphal.
[9] U.S. Pat. No. 7,141,974 and U.S. Pat. No. 7,375,526, William A. Edelstein et al.
[10] *An improved first-approximation theory for thin shells*, J. Lyell Sanders, Jr, NASA, 1959.
[11] *A set of simple, accurate equations for circular cylindrical elastic shells*, James G. Simmonds, Int. J. Solids Structures, 1966, vol 2 pp 525-541.
[12] *Echo Planar Imaging at 4 Tesla With Minimum Acoustic Noise*, D. G. Tomasi & T. Ernst, Journal of magnetic resonance imaging, 18, pp. 128-130, 2003.
[13] http://www.indium.com/products/alloychart.php
[14] *Structure, mechanical properties and electrical resistivity of rapidly solidified Pb—Sn—Cd and Pb—Bi—Sn—Cd alloys*, Mustafa Kamal, Abu Bakr El-Blediwi, Mohamed Bashir Karman, Journal of material science, materials in electronics 9, pp. 425-428, 1998.

What is claimed is:

1. A magnetic resonance imaging system with reduced cryogenic losses and acoustic noise, the system including superconducting windings for creating an intense main magnetic field $\vec{B}_0$ in a usable interior space in the form of a tunnel with axis Z, means for radio-frequency excitation and processing of radio-frequency signals emitted in response by a body or object placed in said usable interior space, a set of solenoid gradient windings for superposing on the intense main magnetic field $\vec{B}_0$ components of an additional magnetic field, said gradient windings being placed in a cylindrical annular space situated between an exterior cryogenic enclosure containing said superconducting windings for creating an intense main magnetic field $\vec{B}_0$ and said usable interior space, and electronic control circuits, the toroidal exterior cryogenic enclosure defining said usable interior space at room temperature in the form of a tunnel with axis Z in which there is placed the set of solenoid gradient windings, said exterior cryogenic enclosure successively comprising from said usable interior space a vacuum enclosure, at least one first thermal screen maintained at a temperature in the range 20 K to 80 K, a helium reservoir at a temperature less than 5 K, and a former for supporting the superconducting windings for creating an intense main magnetic field $\vec{B}_0$, wherein the exterior cryogenic enclosure further includes at least one additional envelope placed between the set of solenoid gradient windings and the vacuum enclosure, the additional envelope being made of a conductive material with electrical resistivity greater than or equal to $7 \times 10^{-8}$ Ω·m and having a characteristic frequency of purely radial vibration less than or equal to the characteristic frequencies of each of the other components of the exterior cryogenic enclosure, and wherein said conductive material of said additional envelope is made of one of the following materials: lead, tin, tin alloy, alloy of lead and at least one of the following elements: tin, bismuth, cadmium.

2. A system according to claim 1, wherein the additional envelope is constituted by a tube located between the set of solenoid gradient windings and the vacuum enclosure without being mechanically connected thereto.

3. A system according to claim 1, wherein the additional envelope is constituted by a tube that is mechanically connected to the set of solenoid gradient windings.

4. A system according to claim 1, wherein the additional envelope is constituted by a tube that is mechanically connected to the vacuum enclosure.

5. A system according to claim 4, wherein the additional envelope is constituted by a tube that is mechanically connected to the vacuum enclosure by gluing or welding.

6. A system according to claim 1, wherein the cryogenic enclosure includes a first thermal screen maintained at a temperature less than or equal to 80 K and a second thermal screen maintained at a temperature less than or equal to 20 K.

7. A system according to claim 1, wherein at least a first thermal screen is made of aluminum or aluminum alloy.

8. A system according to claim 1, wherein the vacuum enclosure and the helium reservoir are made of stainless steel.

9. A system according to claim 1, wherein said former is made of aluminum or aluminum alloy.

10. A system according to claim 1, wherein the additional envelope includes a tubular structure having a mean radius in the range 0.4 m to 0.5 m, thickness in the range 8 mm to 12 mm, and a length in the range 2 m to 4 m.

11. A system according to claim 1, including two or three concentric additional envelopes which are interposed between the set of solenoid gradient windings and the vacuum enclosure.

12. A method of reducing acoustic noise and cryogenic losses in a magnetic resonance imaging system including superconducting windings for creating an intense main magnetic field $\vec{B_0}$ in a usable interior space in the form of a tunnel with axis Z, means for radio-frequency excitation and processing of radio-frequency signals emitted in response by a body or object placed in said usable interior space, a set of solenoid gradient windings for superposing on the intense main magnetic field $\vec{B_0}$ components of an additional magnetic field, said gradient windings being placed in a cylindrical annular space situated between an exterior cryogenic enclosure containing said superconducting windings for creating an intense main magnetic field $\vec{B_0}$ and said usable interior space, and electronic control circuits, the toroidal exterior cryogenic enclosure defining said interior cylindrical space at room temperature in the form of a tunnel of axis Z in which there is placed the set of solenoid gradient windings, the exterior cryogenic enclosure successively comprising from said usable interior space a vacuum enclosure, at least a first thermal screen maintained at a temperature in the range 20 K to 80 K, an helium reservoir at a temperature less than 5 K, and a former for supporting the superconducting windings for creating an intense main magnetic field $\vec{B_0}$, wherein the method includes the step of inserting in the exterior cryogenic enclosure at least one additional envelope placed between the set of solenoid gradient windings and the vacuum enclosure, the additional envelope being made of a conductive material with electrical resistivity greater than or equal to $7\times10^{-8}$ $\Omega\cdot$m and having a characteristic frequency of purely radial vibration less than or equal to the characteristic frequencies of each of the other components of the exterior cryogenic enclosure and wherein said conductive material of said additional envelope is made of one of the following materials: lead, tin, tin alloy, alloy of lead and at least one of the following elements: tin, bismuth, cadmium.

* * * * *